(12) United States Patent
Krivokapic

(10) Patent No.: US 6,440,832 B1
(45) Date of Patent: Aug. 27, 2002

(54) HYBRID MOS AND SCHOTTKY GATE TECHNOLOGY

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/900,311

(22) Filed: Jul. 6, 2001

(51) Int. Cl.$^7$ .............................................. H01L 21/44
(52) U.S. Cl. ........................ 438/597; 438/655; 438/664
(58) Field of Search ................................ 438/118, 257, 438/455, 586, 597, 655, 664

(56) References Cited

U.S. PATENT DOCUMENTS

| | | | | |
|---|---|---|---|---|
| 4,378,628 A | * | 4/1983 | Levinstein et al. | 438/655 |
| 4,868,617 A | * | 9/1989 | Chiao et al. | 257/344 |
| 5,236,118 A | * | 8/1993 | Bower et al. | 438/455 |
| 5,242,847 A | * | 9/1993 | Ozturk et al. | 438/586 |
| 5,296,396 A | * | 3/1994 | Bellezza | 438/257 |
| 5,438,478 A | * | 8/1995 | Kondo et al. | 438/118 |

OTHER PUBLICATIONS

Nanometer patterning of epitaxial CoSi2/Si(100) for ultrashort channel Schottky barrier metal–oxide–semiconductorfield effect transistors, Zhao,Klinkhammer, Dolle, Kappius and Mantl, Applied Physics Letters, Jan. 18, 1999, pp. 454–456.

Schottky Junction Transistor–MicropowerCircuits at GHz Frequencies, Thornton, IEEE Electron Device Letters, vol. 22, No. 1, Jan. 2001, pp. 38–40.

* cited by examiner

*Primary Examiner*—John F. Niebling
*Assistant Examiner*—Walter Lindsay, Jr.

(57) ABSTRACT

In the fabrication of a semiconductor structure, a silicon substrate is provided, and an insulating layer is provided on the substrate. First and second structures are provided on the insulating layer, the first structure comprising a dielectric on the insulating layer, and the second structure comprising polysilicon on the insulating layer and a dielectric on the polysilicon. Source and drain regions are formed in the silicon using the first and second structures as masks.

The dielectric of the first structure is removed, the dielectric of the second structure is removed to expose the polysilicon, and a portion of the insulating layer is removed to expose portions of the silicon of the substrate. Silicide is then grown on exposed portions of silicon and the polysilicon. The present semiconductor structure includes a silicon substrate, a first transistor having a source and a drain the substrate and a Schottky gate, and a second transistor having a source and a drain in the substrate, a gate insulator on the substrate, and a gate on the gate insulator.

11 Claims, 5 Drawing Sheets

HYBRID MOS AND SCHOTTKY GATE TECHNOLOGY

BACKGROUND OF THE INVENTION

1. Field of the Invention

This invention relates generally to semiconductor structures, and more particularly, to MOS and Schottky gate transistors.

2. Discussion of the Related Art

In current semiconductor technology, large area die typically include a number of logic units, each including a large number of closely packed MOS transistors connected within the logic unit by short interconnects. Additionally, interconnects of different lengths connect the logic units. Typically, some of the interconnects connecting the logic units are quite long, i.e., for example more than 50 microns in length. The increased capacitances and resistances accompanying long interconnects increase signal delay and consume power. In order to drive large interconnect capacitances and resistances, MOS transistors with large drive currents are typically provided. However, MOS transistors with large drive currents also have large off-state leakage. Schottky gate transistors have small off-state leakage and small gate capacitance, which provides extremely fast switching thereof with very low power being consumed. However, Schottky gate transistors, while capable of providing sufficient drive current for short interconnects, have insufficient drive currents for long interconnects.

Therefore, what is needed is a semiconductor structure which takes advantage of the characteristics of the above-described MOS and Schottky gate transistors, and a method of fabricating this structure.

SUMMARY OF THE INVENTION

In the present method of fabricating a semiconductor structure, a substrate comprising silicon is provided. An insulating layer is provided on the substrate, and a first structure is provided on the insulating layer, the first structure comprising a dielectric on the insulating layer. A second structure is provided on the insulating layer, the second structure comprising polysilicon on the insulating layer and a dielectric on the polysilicon. Source and drain regions are formed in the silicon of the substrate using the first and second structures and as masks. The dielectric of the first structure is removed, the dielectric of the second structure is removed to expose the polysilicon, and a portion of the insulating layer is removed to expose portions of the silicon of the substrate. Silicide is then grown on exposed portions of silicon and the polysilicon.

The present semiconductor structure comprises a semiconductor substrate, a first transistor having a source and a drain in the substrate and a Schottky gate, and a second transistor having a source and a drain in the substrate, a gate insulator on the substrate, and a gate on the gate insulator.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventor for practicing the invention.

Figure 1:
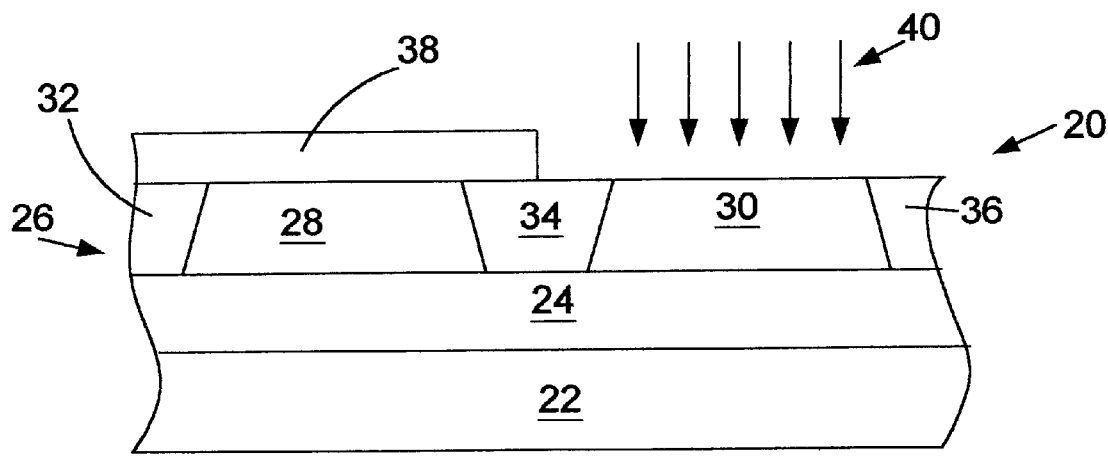
FIGS. 1–12 are sectional views illustrating steps in the present process.

FIG. 1 illustrates a cross-section of a semiconductor structure 20. As shown therein, a silicon wafer 22 has formed thereon a buried oxide layer 24, for example, 2000 angstroms or less thick. The buried oxide layer 24 has formed thereon a substrate 26 of a thickness of for example 500 angstroms +/–100 angstroms, which substrate 26 includes silicon regions 28, 30 and isolation regions 32, 34, 36 in the form of trench oxide regions, isolation region 34 being shown as between the silicon regions 28, 30, all as is well known.

Figure 2:
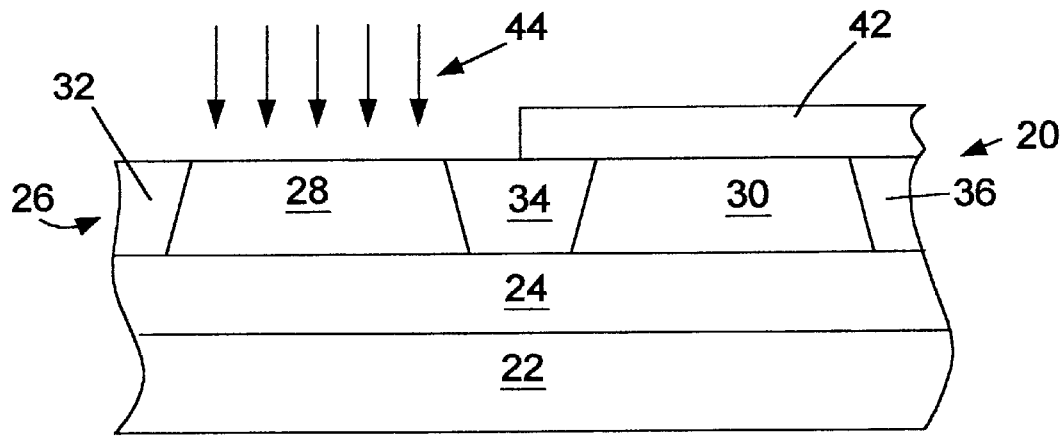

After deposition and appropriate patterning of a photoresist layer, a photoresist portion 38 is provided over the silicon region 28, and a blanket $V_t$ threshold implant 40 is undertaken into the exposed silicon region 30 where an MOS transistor (which may be part of a CMOS structure) is to be formed (for example, if an NMOS transistor is to be formed, the silicon region 30 may be doped with Boron to a level of for example $5E16$-$1E17 cm^{-3}$, while if a PMOS transistor is to be formed, the silicon region 30 may be doped with arsenic to a level of for example $5E16$-$1E17 cm^{-3}$). Subsequently, the photoresist portion 38 is removed, another layer of photoresist is patterned to provide a photoresist portion 42 over the silicon region 30, and the exposed silicon region 28, where a Schottky gate transistor is to be formed, undergoes a blanket $V_t$ threshold implant 44 so as to be doped with for example Arsenic or Phosphorous to a level of, for example, $1E17 cm^{-3}$ (FIG. 2).

Figure 3:
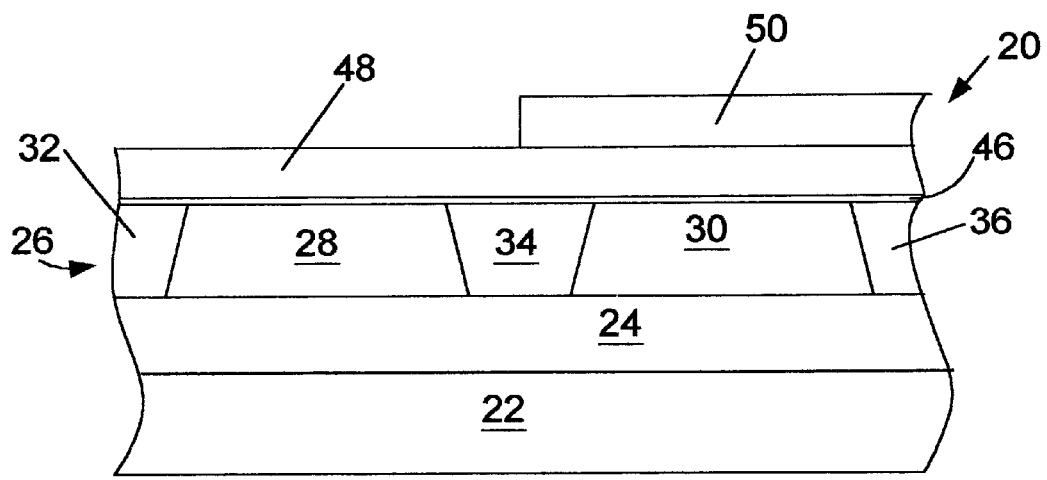
Figure 4:
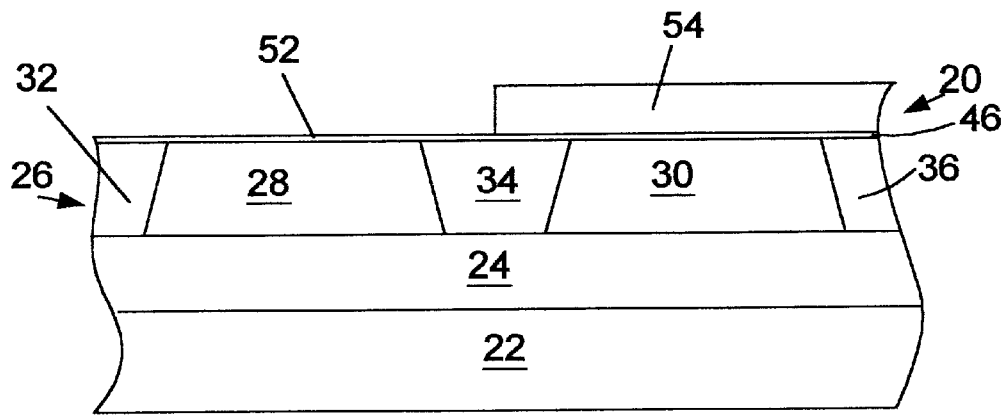

Referring to FIG. 3, after removal of the photoresist portion 42, a thin insulating layer 46, for example a 10–14 angstroms thick silicon dioxide and silicon nitride stack, is provided over the resulting structure, and a polysilicon layer 48 is deposited over the insulating layer 46, to a thickness of for example 1000 angstroms +/–200 angstroms. Another layer of photoresist is provided over the resulting structure and patterned to provide a photoresist portion 50 on the polysilicon layer 48 over the silicon region 30. This photoresist portion 50 is used as a mask during an etching step to etch away a portion of the polysilicon layer 48, leaving a portion 52 of the insulating layer 46 over the silicon region 28 exposed, and leaving a portion 54 of the polysilicon layer over the silicon region 30 (FIG. 4).

Figure 5:
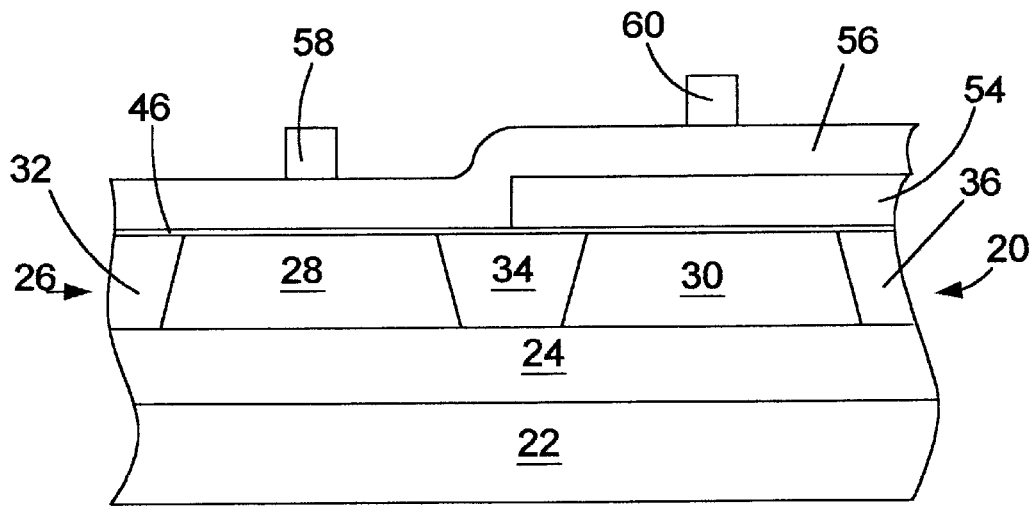

As illustrated in FIG. 5, silicon nitride layer 56 is deposited over the resulting structure (for example to a thickness of 1000 angstroms +/–200 angstroms), covering the exposed portion 52 of the insulating layer 46 and the remaining portion 54 of the polysilicon layer. A layer of photoresist is provided over the resulting structure and is patterned to define photoresist portion 58 on the nitride layer 56 and over the silicon region 28, and photoresist portion 60 on the nitride layer 56 over the polysilicon portion 54 and over the silicon region 30.

Figure 6:
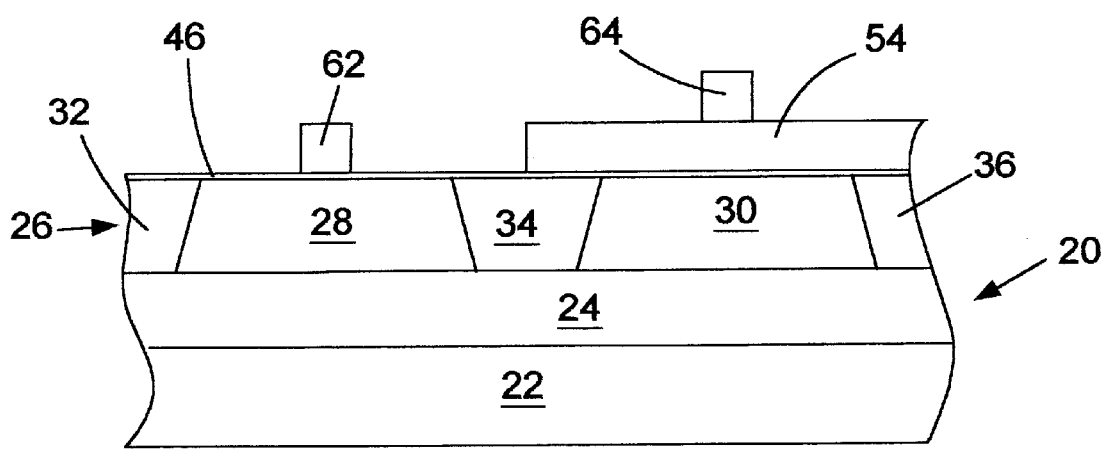
Figure 7:
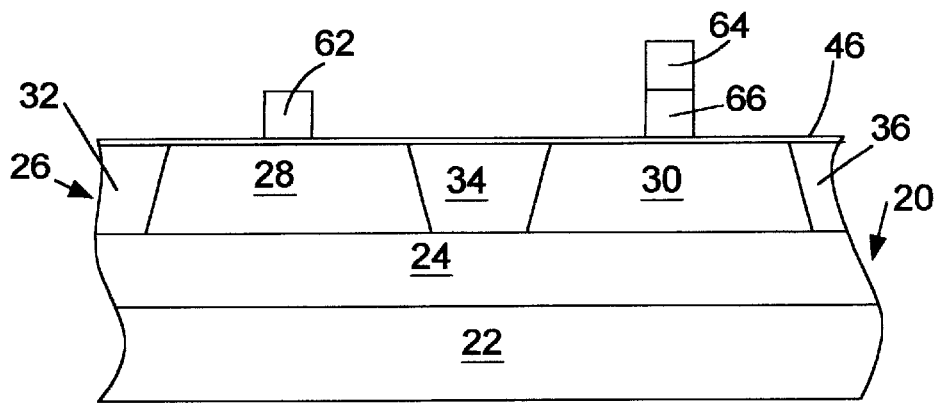

These photoresist portions 58, 60 are used as masks during an etching step in the formation of nitride bodies 62, 64, and then the photoresist portions 58, 60 are removed (FIG. 6), leaving nitride body 62 on the insulating layer 46 over the silicon region 28, and nitride body 64 on the remaining portion 54 of the polysilicon 54 over the silicon region 30. Then, an etching step of the polysilicon 54 is undertaken, using the nitride body 64 as a mask, forming polysilicon body 66 and resulting in the structure shown in FIG. 7.

Figure 8:
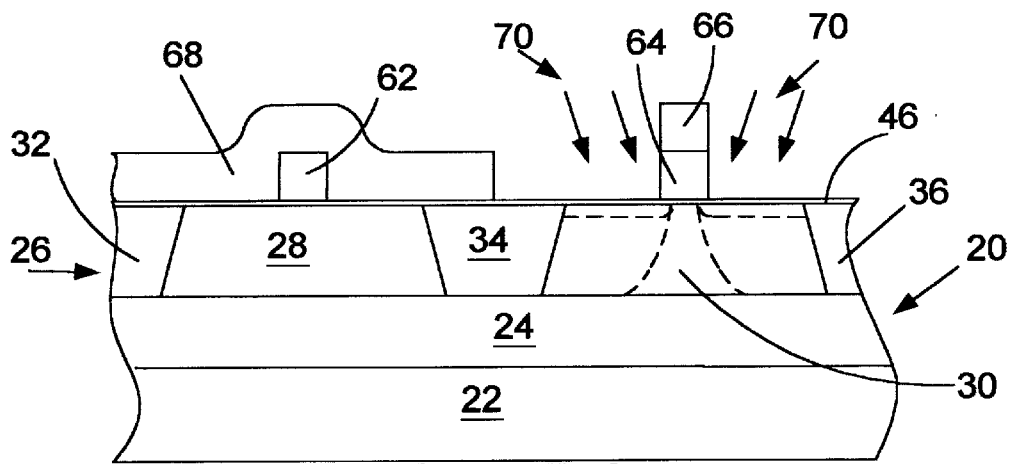
Figure 9:
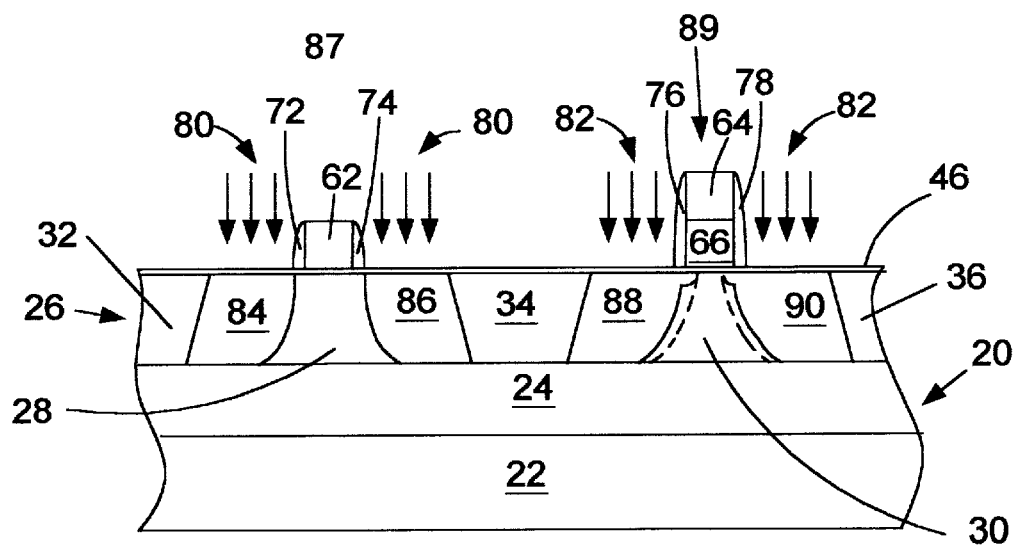

Referring to FIG. 8, again, a layer of photoresist is provided over the structure and is patterned to provide a photoresist portion 68 over the silicon region 28. Next, angled implants 70 are undertaken to form halos and extensions in the silicon region for the MOS transistor to be formed: The following parameters may be used;
NMOS:
Shallow halos: Boron—4×(0.6–1.0e13) @ 2–3 KeV, tilt range 25–45°
Deep halos: Boron—4×(0.5–0.8e13)@ 10–15 KeV, tilt range 20–30°
Extensions: Arsenic—5e14–1e15 @ 1.5–2.5 KeV
PMOS:
Shallow halos: Arsenic—4×(0.6–1.0e13)@ 10–15 KeV, tilt range 25–45°
Deep Halos: Phosphorous—4×(0.5–0.8e13)@ 20–25 KeV, tilt range 20–30°
Extensions: Boron—5e14–1e15 @ 0.5–1.5 KeV After removal of the photoresist portion 68, oxide spacers 72, 74 (for example 250–400 angstroms in width) are formed by conventional means on the sides of the nitride body 62, and oxide spacers 76, 78 are formed on the sides of the nitride body 64 and polysilicon body 66 (FIG. 9).

Next, source and drain implants 80, 82 are undertaken in the silicon region 28 and in the silicon region 30 (FIG. 9), with appropriate photoresist masking, of one of the silicon regions while the other is being implanted. For formation of the source and drain regions 84,86 in the silicon region 28, the structure 87 made up of nitride body 62 and spacers 72, 74 is used as a mask. For formation of the source and drain regions 88, 90 in the silicon region 30, the structure 89 made up of nitride body 64, polysilicon body 66, and spacers 76, 78 is used as a mask. The implants of the source and drain regions 84, 86, 88, 90 are deep enough to bottom on the junctions at the interface of the buried oxide layer 24 with the silicon regions 28, 30. The implants are annealed, for example, in RTA at 1000–1025° C. for 10–20 seconds.

Figure 10:
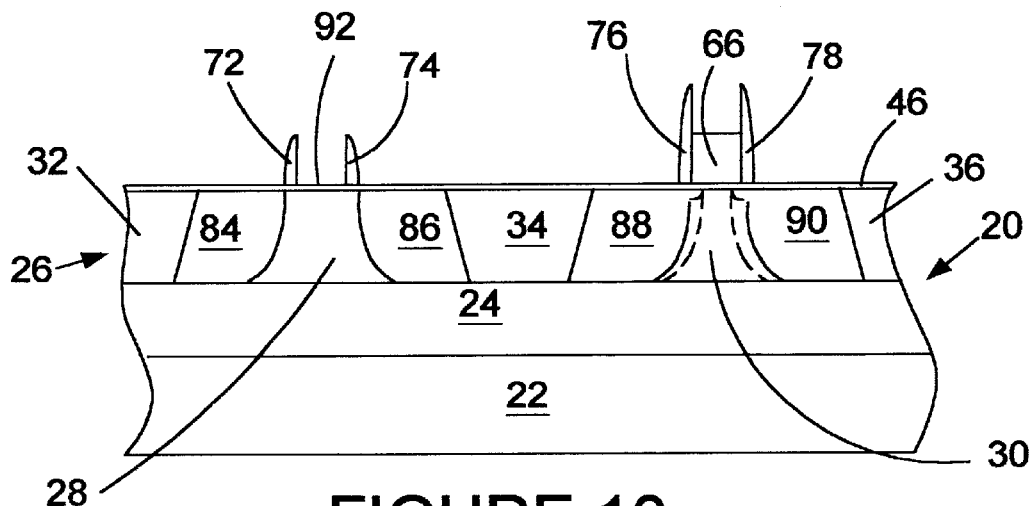
Figure 11:
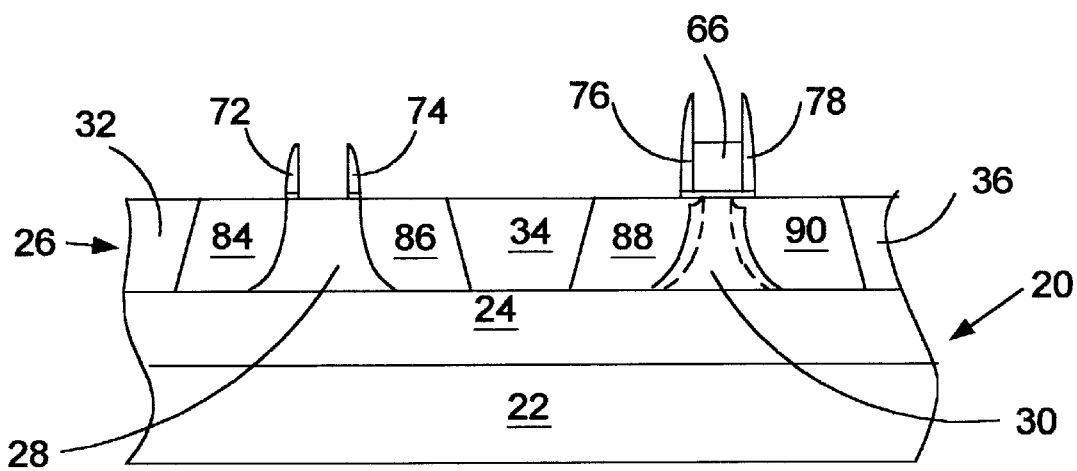
Figure 12:
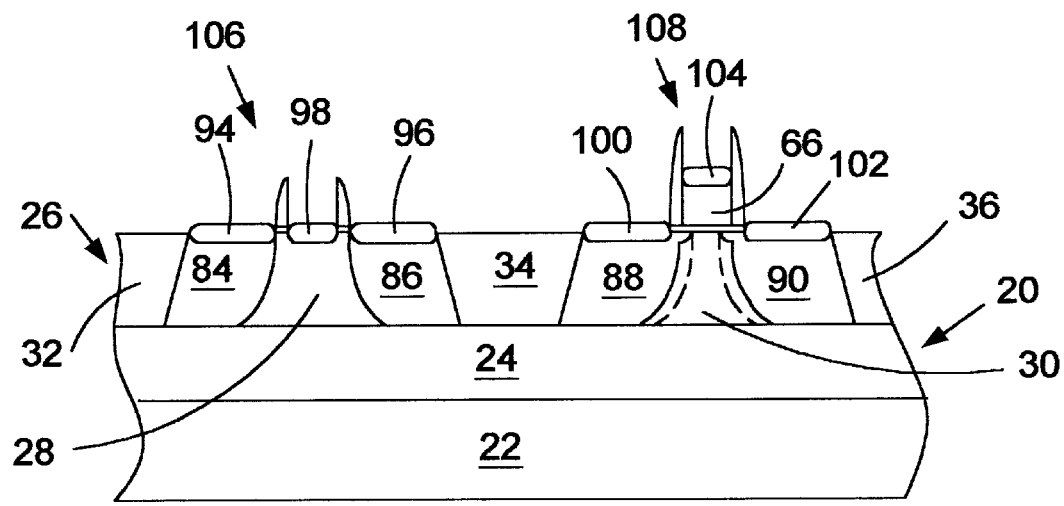

With reference to FIG. 10, the nitride bodies 62, 64 are removed by conventional means, for example by wet etch using hot phosphoric acid, leaving the top of the polysilicon body 66 exposed. Portions of the insulating layer 46 are removed from over the source/drain regions 84, 86 of the silicon region 28, the region 92 between the spacers 72, 74, and from over the source/drain regions 88, 90 of the silicon region 30 (FIG. 11), using, for example, a short HF acid dip, the polysilicon body 66 blocking removal of the portion of the oxide layer 46 thereunder. A thin layer of cobalt (for example, 100–150 angstroms thick) is deposited over the resulting structure, and $CoSi_2$ is grown over the exposed portions of the silicon, forming $CoSi_2$ bodies 94, 96 contacting the source and drain regions 84, 86, a $CoSi_2$ gate 98, $CoSi_2$ bodies 100, 102 in contact with the source and drain regions 88, 90, and a $CoSi2$ body 104 contacting the polysilicon gate 66 (FIG. 12). Further steps are then undertaken to complete the device 106 thus formed as a Schottky gate transistor, and the device 108 thus formed as an MOS transistor.

It will be seen that both Schottky gate and MOS transistors are readily formed on the same substrate through the described and illustrated process. Furthermore, the process is simple and effective, requiring a minimum number of steps.

It will be understood that in practicing the present process, Schottky gate and MOS transistors need not be formed immediately adjacent each other as shown and described, but can be spaced apart anywhere on a die.

Figure 13:
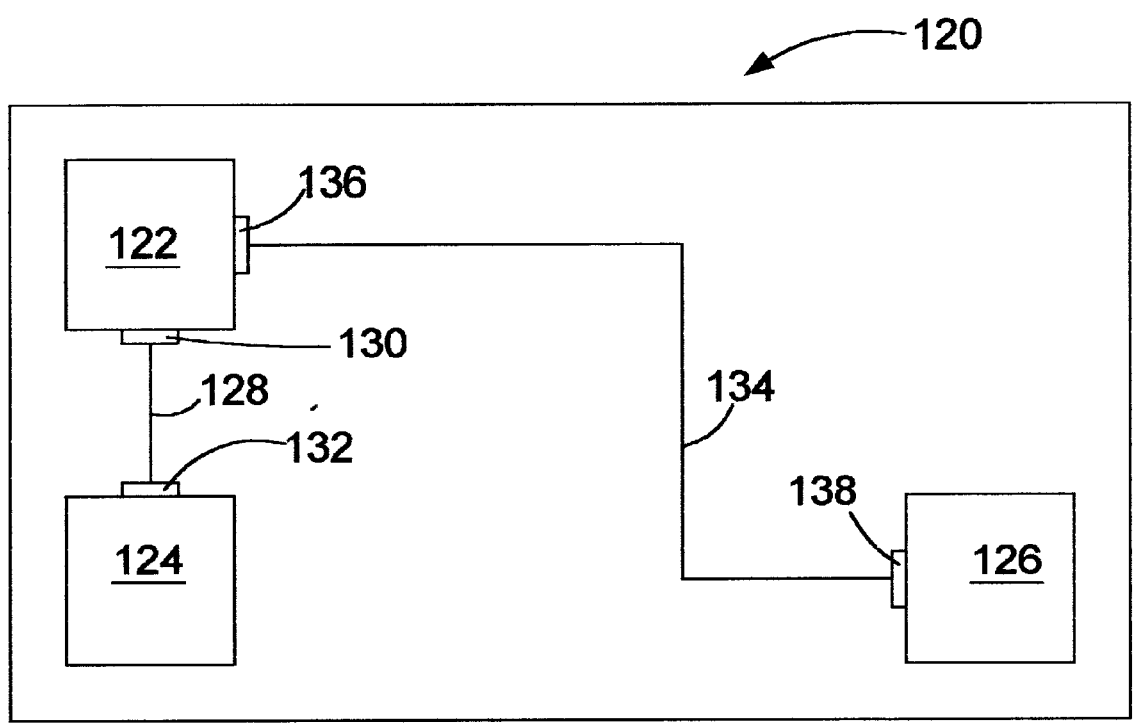
FIG. 13 is a plan view of a semiconductor die incorporating the present invention.

FIG. 13 shows a die 120 having a plurality of logic units 122, 124, 126 thereon. Since the logic units 122, 124, 126 are made up of a plurality of closely packed transistors having very short interconnects, Schottky gate transistors can readily be used they are in, reducing overall power consumption and increasing operational speed. In the case where a relatively short interconnect 128 connects logic units 122, 124 again, Schottky gate transistors 130, 132 can readily be used. However, for long interconnects, i.e., for example, that shown at the 134, greater drive current is needed, and MOS transistors 136, 138 may be used to drive this interconnect 134. Thus, low-power rapid switching Schottky gate transistors are used where appropriate, while MOS transistors are also used where appropriate, increasing overall operating efficiency of the die 120.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. AU such modifications and variations are within the scope of the invention as determined by the appended claims when interpreted in accordance with the breadth to which they are fairly, legally and equitably entitled.

What is claimed is:

1. A semiconductor fabrication method comprising:
   providing a substrate comprising silicon;
   providing an insulating layer on the substrate;
   providing a first structure on the insulating layer, the first structure comprising a dielectric on the insulating layer;
   providing a second structure on the insulating layer, the second structure comprising polysilicon on the insulating layer and a dielectric on the polysilicon;
   forming source and drain regions in the silicon of the substrate using the first and second structure as masks;
   removing the dielectric of the first structure, the dielectric of the second structure to expose the polysilicon, and a portion of the insulating layer to expose portions of the silicon of the substrate; and
   growing silicide on exposed portions of silicon and the polysilicon.

2. The method of claim 1 and further comprising the step of providing that the first structure comprises a first set of spacers, and the second structure comprises a second set of spacers, the first and second sets of spacers being provided prior to forming the source and drain regions using the first and second structure as masks.

3. The method of claim 1 and further comprising the step of providing that the substrate comprises first and second silicon regions and an isolation region between the first and second silicon regions.

4. The method of claim 1 and further comprising the step of providing that the insulating layer comprises an oxide layer.

5. The method of claim 1 and further comprising the step of providing that the dielectric of the first structure is a nitride, and the dielectric of the second structure is a nitride.

6. A semiconductor fabrication method comprising:
   providing a substrate comprising first and second silicon regions and an isolation region between the first and second silicon regions;
   providing an insulating layer on the substrate;
   providing a first structure on the insulating layer over the first silicon region, the first structure comprising a dielectric on the insulating layer;
   providing a second structure on the insulating layer over the second silicon region, the second structure comprising polysilicon on the insulating layer and a dielectric on the polysilicon;
   forming source and drain regions in the first silicon region using the first structure as a mask;
   forming source and drain regions in the second silicon region using the second structure as a mask;
   removing the dielectric of the first structure, the dielectric of the second structure to expose the polysilicon, and portions of the insulating layer to expose portions of the silicon of the substrate; and
   growing silicide on exposed portions of silicon and the polysilicon.

7. The method of claim 6 and further comprising the step of providing that the first structure comprises a first pair of spacers on the sides of the dielectric of the first structure, the first pair of spacers being provided prior to forming the source and drain regions in the first silicon region using the first structure as a mask, and the second structure comprises a second pair of spacers on the sides of the dielectric and the polysilicon of the second structure, the second pair of spacers being provided prior to forming the source and drain regions in the second silicon region using the second structure as a mask.

8. The method of claim 6 and further comprising the step of providing that the insulating layer comprises an oxide layer.

9. The method of claim 6 and further comprising the step of providing that the dielectric of the first structure is a nitride, and the dielectric of the second structure is a nitride.

10. A method of fabricating a semiconductor structure comprising:
    providing a substrate comprising first and second silicon regions and an isolation region between the first and second silicon regions;
    providing an insulating layer on the substrate;
    providing a polysilicon layer on the insulating layer;
    removing a portion of the polysilicon layer from over the first silicon region, leaving a portion of the polysilicon layer over the second silicon region;
    providing a nitride layer over the resulting structure;
    providing a photoresist layer over the nitride layer;
    patterning the photoresist layer to provide a first portion thereof on the nitride layer over the first silicon region, and a second portion thereof on the nitride layer over the second silicon region;
    removing portions of the nitride layer, using the first and second portions of the photoresist as masks, leaving a first nitride body on the insulating layer over the first silicon region, and a second nitride body on the remaining portion of the polysilicon layer and over the second silicon region;
    removing portions of the remaining portion of the polysilicon layer to provide a polysilicon body, using the second nitride body as a mask;
    providing a first pair of spacers on sides of the first nitride body;
    providing a second pair of spacers on sides of the second nitride body and polysilicon body;
    forming source and drain regions in the first silicon region using the first nitride body and first pair of spacers thereon as a mask;
    forming source and drain regions in the second silicon region using the second nitride body, polysilicon body, and second pair of spacers thereon as a mask;
    removing the first and second nitride bodies, removal of the second nitride body exposing the polysilicon body;
    removing portions of the insulating layer to expose portions of the first and second silicon regions; and
    growing silicide on exposed portions of the first and second silicon regions and the polysilicon.

11. The method of claim 10 and further comprising the step of providing that the insulating layer comprises an oxide layer.

* * * * *